US009864341B1

(12) United States Patent
Zhuang

(10) Patent No.: US 9,864,341 B1
(45) Date of Patent: Jan. 9, 2018

(54) TIME-TO-DIGITAL CONVERSION WITH LATCH-BASED RING

(71) Applicant: QUALCOMM Incorporated, San Diego, CA (US)

(72) Inventor: Jingcheng Zhuang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/368,375

(22) Filed: Dec. 2, 2016

(51) Int. Cl.
*H03M 1/50* (2006.01)
*G04F 10/00* (2006.01)

(52) U.S. Cl.
CPC .................................. *G04F 10/005* (2013.01)

(58) Field of Classification Search
CPC ..................................................... G04F 10/005
USPC ................................................. 341/166, 155
See application file for complete search history.

(56) References Cited

U.S. PATENT DOCUMENTS 7,477,112 B1 1/2009 Pi et al.
8,138,843 B2 3/2012 Straayer et al.
8,860,512 B2 10/2014 Schimper
8,878,613 B2 11/2014 Wang et al.
9,104,181 B1 8/2015 Jung et al.
2005/0259239 A1* 11/2005 Lin ......................... G01S 7/285 356/5.01
2015/0074156 A1* 3/2015 Degani ..................... G06F 5/00 708/204

* cited by examiner

*Primary Examiner* — Peguy Jean Pierre
(74) *Attorney, Agent, or Firm* — Colby Nipper/Qualcomm

(57) ABSTRACT

An integrated circuit (IC) is disclosed for time-to-digital conversion with a latch-based ring. In example aspects, the IC includes a ring, a counter, an encoder, and time-to-digital converter (TDC) control circuitry. The ring includes multiple ring stages and propagates a ring signal between successive ring stages. Each respective ring stage includes latch circuitry to secure a state of the ring signal at the respective ring stage. The ring provides a ring output signal using the latch circuitry of each of the ring stages. The ring is coupled to the counter. The counter increments a counter value responsive to the ring signal and provides a counter output signal based on the counter value. The encoder is coupled to the ring and the counter. The encoder generates a TDC output signal based on the ring and counter output signals. The TDC control circuitry operates the ring responsive to a TDC input signal.

30 Claims, 12 Drawing Sheets

308

TIME-TO-DIGITAL CONVERSION WITH LATCH-BASED RING

TECHNICAL FIELD

This disclosure relates generally to conversion of an elapsed time to a digital representation and, more specifically, to implementing a time-to-digital converter (TDC) having a ring with multiple ring stages that each include latch circuitry.

BACKGROUND

The operation of a computing device, such as a web server or a smart phone, frequently depends on the timing of a duration of some occurrence. Occurrences can include a communication involving a transmission and a reception, a performance of a procedure, a user input/output (I/O) exchange to provide user output and accept user input, and the like. The duration of an occurrence is defined by an initiating event and a terminating event. Thus, respective examples of corresponding terminating events include a signal arrival, a completion of a procedure, and a detection of user input. Computing devices can convert an occurrence having some duration to a digital representation of the corresponding elapsed time using a time-to-digital converter (TDC).

Conventional TDCs provide a TDC output value from an encoder using a ring oscillator that is coupled to at least two different counters. The ring oscillator includes a series of inverters. The series of inverters changes a ring oscillator output value as a ring oscillator signal propagates along the series of inverters. At the last inverter of the series, the ring oscillator signal is looped back to the first inverter to form the ring oscillator. After the last inverter of the series, the ring oscillator signal is further coupled to an end counter having an end counter value that keeps track of how many times the ring oscillator signal has looped through the ring oscillator.

Conventional TDCs also include multiple flip-flops. Each respective flip-flop of a first set of flip-flops corresponds to a respective inverter of the series of inverters of the ring oscillator. At the termination of an occurrence being timed, a respective flip-flop samples an output of each respective inverter along the series of inverters to obtain the ring oscillator output value. A second set of flip-flops is employed to sample the end counter value from the end counter. The encoder receives the ring oscillator output value via the first set of flip-flops corresponding to the series of inverters and the end counter value via the second set of flip-flops corresponding to the end counter. From the ring oscillator output value and the end counter value, the encoder produces the TDC output value.

However, there is signaling ambiguity between the ring oscillator and the end counter. There is a timing problem for the ring oscillator signal after the last inverter of the ring oscillator and just before the end counter. The arrival of the signal to trigger the end counter is subject to some degree of uncertainty, such as when the time of the terminating event is near the time of triggering the end counter. Consequently, at least one additional, interior counter is included as part of the conventional TDC near the middle of the ring oscillator. This interior counter receives a signal from an interior inverter of the series of inverters to track an interior counter value as a check against the end counter value of the end counter. To decipher which counter currently has a correct counter value, the encoder also includes error correction logic.

Unfortunately, implementing both the interior counter and the error correction logic involves deploying numerous additional circuit devices on a TDC portion of an integrated circuit (IC) chip. These additional circuit devices increase both the cost and the complexity of designing and producing the integrated circuit chip. Further, operating these additional circuit devices generates more heat and increases the power demands of the integrated circuit chip, which together reduce the battery life of the computing device in which the integrated circuit chip is functioning.

SUMMARY

In an example aspect, an integrated circuit is disclosed. The integrated circuit includes a ring, a counter, an encoder, and time-to-digital converter (TDC) control circuitry. The ring includes multiple ring stages and is configured to propagate a ring signal between successive ring stages of the multiple ring stages. Each respective ring stage includes latch circuitry configured to secure a state of the ring signal at the respective ring stage. The ring is further configured to provide a ring output signal using the latch circuitry of each of the multiple ring stages. The counter is coupled to the ring and is configured to increment a counter value responsive to the ring signal. The counter is further configured to provide a counter output signal based on the counter value. The encoder is coupled to the ring and to the counter. The encoder is configured to generate a TDC output signal based on the ring output signal and the counter output signal. The TDC control circuitry is configured to operate the ring responsive to at least one TDC input signal.

In an example aspect, an integrated circuit is disclosed. The integrated circuit includes a ring, a counter, an encoder, and TDC control circuitry. The ring is configured to propagate a ring signal over the ring across multiple ring stages and to provide a ring output signal. Each respective ring stage of the multiple ring stages includes means for latching a state of the ring signal at the respective ring stage. The ring is coupled to the counter. The counter is configured to increment a counter value responsive to the ring signal and to provide a counter output signal based on the counter value. The encoder is coupled to the ring and to the counter. The encoder is configured to generate a TDC output signal based on the ring output signal and the counter output signal. The TDC control circuitry is configured to operate the ring responsive to at least one TDC input signal.

In an example aspect, a method for time-to-digital conversion with a latch-based ring is disclosed. The method includes propagating a ring signal between multiple ring stages of a ring, with the ring signal including complementary voltage levels. The method also includes incrementing a counter value responsive to the ring signal. The method further includes inverting and latching in each respective ring stage of the multiple ring stages. More specifically, the complementary voltage levels of the ring signal are inverted to produce inverted complementary voltage levels. Additionally, the inverted complementary voltage levels of the ring signal are latched to produce latched complementary voltage levels of the ring signal at the respective ring stage. The method still further includes providing a ring output signal indicative of the latched complementary voltage levels of the multiple ring stages of the ring and providing a counter output signal indicative of the counter value. A digital representation of an elapsed time is generated based on the ring output signal and the counter output signal.

In an example aspect, an integrated circuit is disclosed. The integrated circuit includes a TDC that is configured to produce a TDC output signal based on a ring value. The TDC includes a ring that propagates a ring signal over multiple ring stages and establishes the ring value with the multiple ring stages. Each respective ring stage includes oscillation circuitry and latch circuitry. The oscillation circuitry is configured to receive the ring signal from a preceding ring stage and to invert complementary voltage levels of the ring signal to produce inverted complementary voltage levels for the respective ring stage. The latch circuitry is configured to latch the inverted complementary voltage levels to produce latched complementary voltage levels for the respective ring stage and to forward the latched complementary voltage levels to a succeeding ring stage.

DETAILED DESCRIPTION

Figure 1:
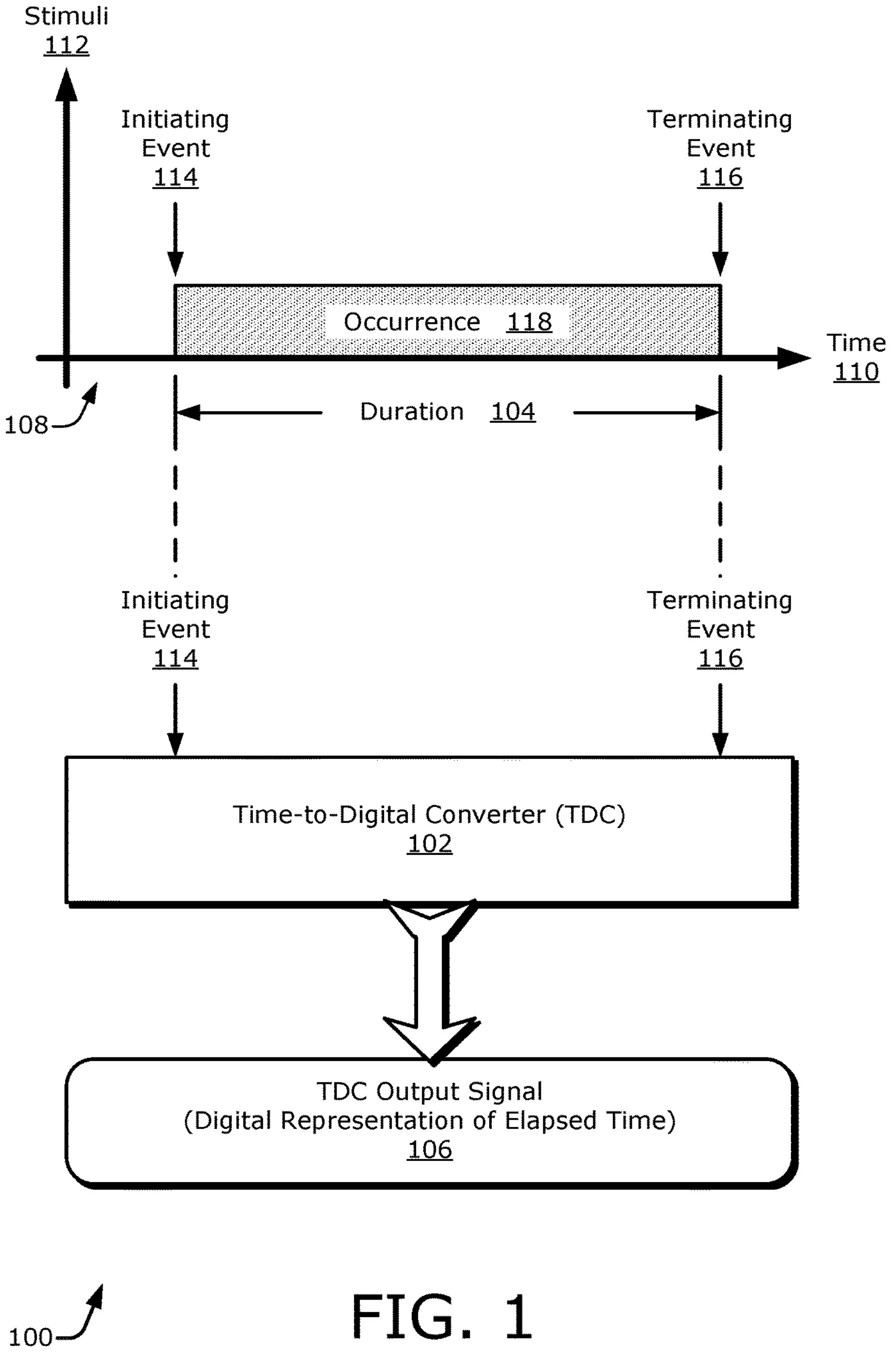
FIG. 1 illustrates an example operational paradigm for a time-to-digital converter (TDC) that can be implemented on an integrated circuit.

In contrast with conventional time-to-digital converters (TDCs), the TDC implementations that are described herein can reduce by half the number of counters used to merely a single counter. Consequently, such implementations can also obviate the inclusion of error correction logic that is dedicated to deciphering multiple counter values in the encoder. Furthermore, described implementations can eliminate the use of multiple flip-flops for securing values internal to the TDC.

Conventional TDCs typically include at least a ring oscillator, an end counter, and an encoder. However, conventional TDCs implement an additional, interior counter along the middle of the ring oscillator and error correction logic in the encoder to account for the interior counter. This extra circuitry requires numerous additional circuit devices to be included in a TDC portion of an integrated circuit (IC) chip. Besides the interior counter and the related error correction logic, conventional TDCs utilize other circuitry that requires numerous additional circuit devices to implement.

For example, conventional TDCs utilize three sets of flip-flops. A first set of flip-flops is used to obtain an oscillator ring value from the ring oscillator. Specifically, one flip-flop is used per inverter of a series of inverters forming the ring oscillator. This first set of flip-flops is designed to secure the ring value that exists when a terminating event occurs, even though the ring oscillator continues to loop an oscillating signal and therefore create a changing ring value. A second set of flip-flops is used to obtain an end counter value from the end counter, and a third set of flip-flops is used to obtain an interior counter value from the interior counter. One flip-flop per bit of counter value is used in each of these second and third sets of flip-flops for the end and interior counters, respectively. Thus, many flip-flops are used by a single conventional TDC, and each flip-flop requires numerous circuit devices to build the flip-flop.

In contrast, as described herein generally, a TDC includes a ring, a counter, and an encoder. The ring includes multiple ring stages with each ring stage including oscillation circuitry and latch circuitry. The oscillation circuitry includes at least one inverter and enablement circuitry. The enablement circuitry enables an individual ring stage to be enabled or disabled. If the ring stages are enabled responsive to an initiating event, a ring signal propagates through the ring stages. If the ring stages are disabled responsive to a terminating event, propagation of the ring signal ceases. The latch circuitry of each ring stage secures a ring stage value as part of a ring value to be provided by the ring as a ring output signal. The latch circuitry can be realized using, for example, a pair of cross-coupled inverters.

The enablement circuitry can prevent the ring signal from continuing to propagate after a terminating event. Consequently, the ring value of the ring and a counter value of the counter do not continue to change after the terminating event. The latch circuitry of each ring stage can maintain a corresponding ring stage value, so a first set of flip-flops need not be employed to secure the ring value for the ring output signal. Further, by ceasing propagation of the ring signal, there is therefore no signal timing ambiguity at the counter. As a result, a single counter can be employed, and this single counter need not be sampled using a second set of flip-flops because the ring signal propagation is stopped. The third set of flip-flops used in conventional TDCs is also obviated with the omission of the interior counter.

In example implementations, a TDC is responsive to an initiating event and a terminating event and generates a TDC output signal that serves as a digital representation of an elapsed time between the two events. The TDC includes a ring, a counter, and an encoder. The ring produces a ring output signal that is provided to the encoder. The ring also provides an increment indication to the counter. The counter produces a counter output signal that is provided to the encoder based on a counter value. The encoder uses the ring output signal and the counter output signal to generate the TDC output signal.

The ring includes multiple ring stages that are coupled to each other in series to form a signaling ring. In operation, a ring signal propagates through the ring stages. After each pass through the ring, the ring signal is applied to the counter as an increment indication, and the counter increments a counter value. The ring signal can include complementary voltage levels. Accordingly, each ring stage is capable of propagating a complementary-valued signal. Each ring stage corresponds to a ring stage state based on current voltage levels of the commentary-valued signal. The combined states of the multiple ring stages extending along the ring serve as a ring value for the ring, which is made available as the ring output signal.

Each ring stage includes oscillation circuitry, initialization circuitry, and latch circuitry. Generally, the latch circuitry is capable of securing the ring stage state of the corresponding ring stage. The initialization circuitry is implemented to initialize a particular ring stage with an initial ring stage state. The oscillation circuitry is implemented to enable the ring signal to oscillate voltage levels between low and high levels. For example, the oscillation circuitry can include two inverters that are coupled in parallel with respect to each other and in series with respect to the two inverters included as part of adjacent ring stages (e.g., a preceding ring stage and a succeeding ring stage). The oscillation circuitry also includes enablement circuitry that is implemented to enable or disable propagation of the ring signal through the oscillation circuitry. Disabling propagation of the ring signal causes the ring value to stop changing in the ring and prevents the ring signal from continuing to increment the counter value in the counter after the terminating event.

The latch circuitry secures the current voltage levels of the complementary-valued ring signal at each ring stage. The latch circuitry maintains the voltage levels present at the ring stage when the oscillation circuitry of the ring stage is disabled by the enablement circuitry. The latch circuitry is implemented using, for example, a pair of cross-coupled inverters. The cross-coupled inverters are coupled between the opposite voltage levels of the ring signal. The cross-coupled inverters also enforce the complementary voltage levels of the ring signal during propagation of the ring signal.

In operation, the disablement of the ring using the enablement circuitry in each ring stage prevents the ring value and the counter value from changing after the terminating event. The latch circuitry in each ring stage maintains the state of the ring stage as of the terminating event. Consequently, the encoder can obtain the ring value from the multiple ring stages and the counter value from the counter without using sets of flip-flops. The encoder encodes the ring value as least-significant-bits (LSBs) of the digital representation of the elapsed time and incorporates the counter value as the most-significant-bits (MSBs) of the digital representation.

In these manners, the use of flip-flops to secure internal values of a TDC can be eliminated, a single counter can be used, and error correction logic that is dedicated to deciphering multiple counter values in the encoder can therefore be omitted. The encoder can derive the LSBs of a TDC output signal from a ring output signal and can obtain the MSBs directly from a counter output signal without encoding. Furthermore, by eliminating the use of at least some flip-flops, less power is consumed, and integral non-linearity (INL) is decreased. Additionally, the single counter may be implemented using a high-speed ripple counter, which simplifies the design and reduces both area and power consumption.

Using the techniques described herein, the number of ring stages in the ring can be reduced, and the ring frequency can be increased, up to the speed of the counter. Consequently, described TDC implementations can occupy a smaller area and provide superior linearity. Using a described approach that includes two inverters in the oscillation circuitry of each ring stage, a programmable resolution for the TDC can also be implemented. By selectively enabling part of the oscillation circuitry of each ring stage, a low, medium, or high temporal resolution can be achieved, as is described herein below.

FIG. 1 illustrates an example operational paradigm 100 for a time-to-digital converter (TDC), or TDC 102, that can be implemented on an integrated circuit. The TDC 102 produces a TDC output signal 106 that is a digital representation of an elapsed time of an occurrence 118. A graph 108 shows example aspects of the occurrence 118. The graph 108 includes a time axis 110 as the abscissa axis (x-axis) and a stimuli axis 112 as the ordinate axis (y-axis).

The occurrence 118 extends over some time period having a duration 104 along the time axis 110. Two stimuli define an initiating time and a terminating time along the time axis 110 that define a beginning point and an ending point of the occurrence 118. These two stimuli include an initiating event 114 and a terminating event 116. For an example time-of-flight (TOF) occurrence, the initiating event 114 corresponds to a transmission of a wireless signal, and the terminating event 116 corresponds to a reception of a wireless signal.

In operation, the TDC 102 receives an indication of the initiating event 114 and an indication of the terminating event 116. The initiating event 114 and the terminating event 116 are used as a starting time and a stopping time, respectively, for the duration 104 of the occurrence 118. The TDC 102 tracks elapsed time between these two events to produce the TDC output signal 106. The TDC output signal 106 can be realized as a digital representation of (e.g., using binary numerals for) the elapsed time.

Figure 2:
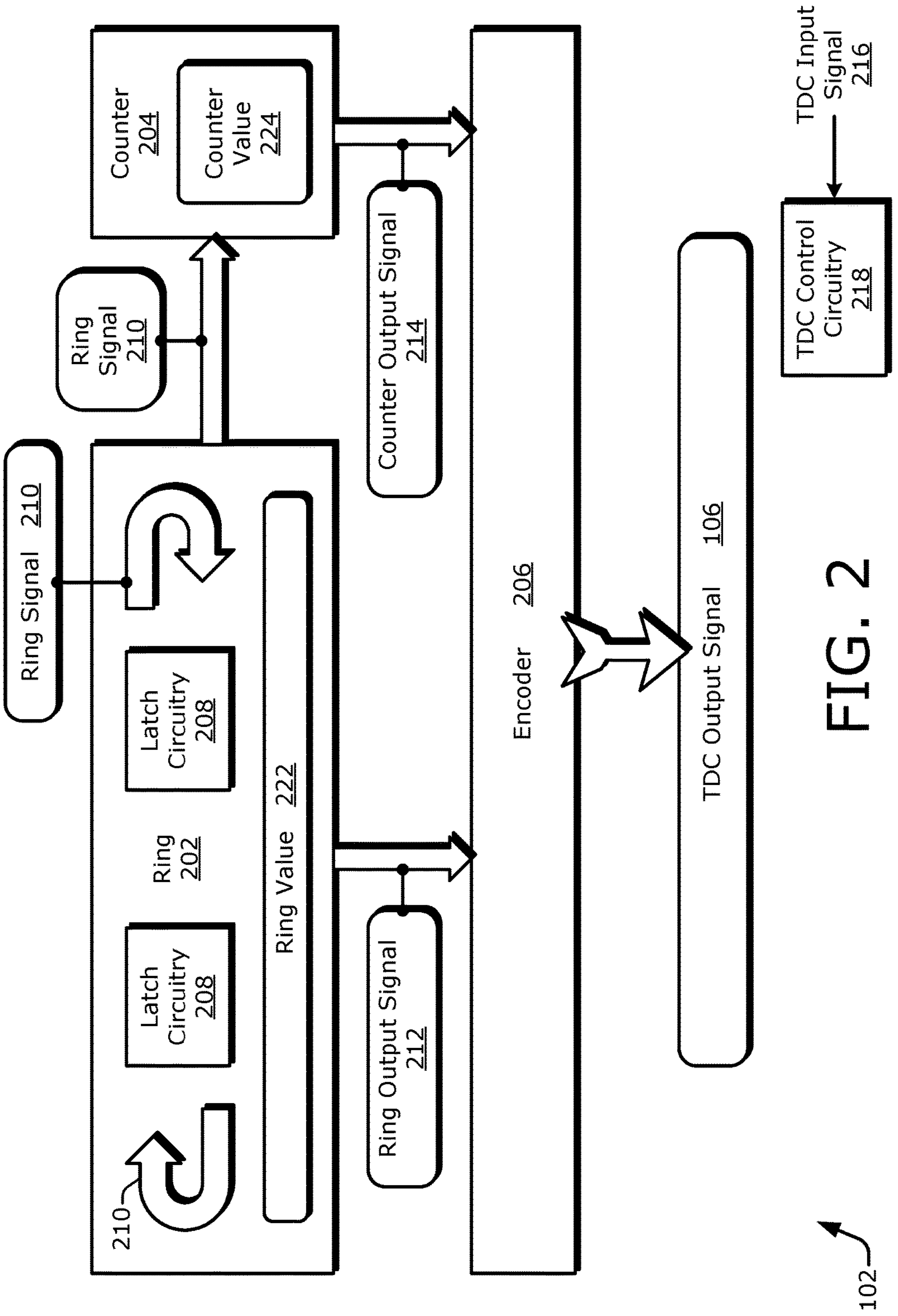
FIG. 2 is a logical diagram illustrating an example TDC including associated TDC control circuitry.

FIG. 2 is a logical diagram illustrating an example TDC 102 including associated TDC control circuitry 218. The TDC 102 includes a ring 202, a counter 204, and an encoder 206. The TDC control circuitry 218 can form a part of, or can be separate from, the TDC 102. Generally, the TDC control circuitry 218 controls operation of the TDC 102 responsive to at least one TDC input signal 216. The TDC input signal 216 is based on two or more stimuli, such as an initiating event 114 and a terminating event 116 of FIG. 1, that are indicative of a duration 104 to be measured.

The ring 202 is coupled to the counter 204. The ring 202 and the counter 204 are coupled to the encoder 206. The ring 202 propagates a ring signal 210 around the ring 202 in a loop to create a ring value 222. The ring 202 includes latch circuitry 208. The latch circuitry 208 is capable of latching the ring value 222 as realized by the overall state of the ring signal 210. At the conclusion of each loop of the ring signal 210 over the ring 202, the ring 202 provides the ring signal 210 to the counter 204. The ring signal 210 serves as an increment indication or signal with respect to the counter 204. Thus, responsive to the ring signal 210, the counter 204 increments a counter value 224 after each loop of the ring signal 210 around the ring 202.

In operation, the TDC control circuitry 218 starts and stops propagation of the ring signal 210 around the ring 202 based on the TDC input signal 216. The propagation of the ring signal 210 is started at a time corresponding to the initiating event 114, and the propagation is stopped at a subsequent time corresponding to the terminating event 116. This starting and stopping is performed using an enablement scheme that is described herein. At the subsequent time corresponding to the terminating event 116, the latch circuitry 208 secures the ring value 222 as realized by the overall state of the ring signal 210. The latch circuitry 208 maintains the ring value 222 after propagation of the ring signal 210 ceases. The ring 202 provides the ring value 222 as a ring output signal 212 via the latch circuitry 208. The counter 204 provides the counter value 224 as a counter output signal 214.

The encoder 206 receives the ring output signal 212 from the ring 202 and the counter output signal 214 from the counter 204. Based on the ring output signal 212 and the counter output signal 214, the encoder 206 generates an encoder output signal as the TDC output signal 106. The encoder 206 combines the ring value 222 with the counter value 224 to produce a digital representation of the duration 104 of some occurrence 118. The TDC output signal 106 can be forwarded to other circuit devices or components of an integrated circuit for further processing.

Figure 3:
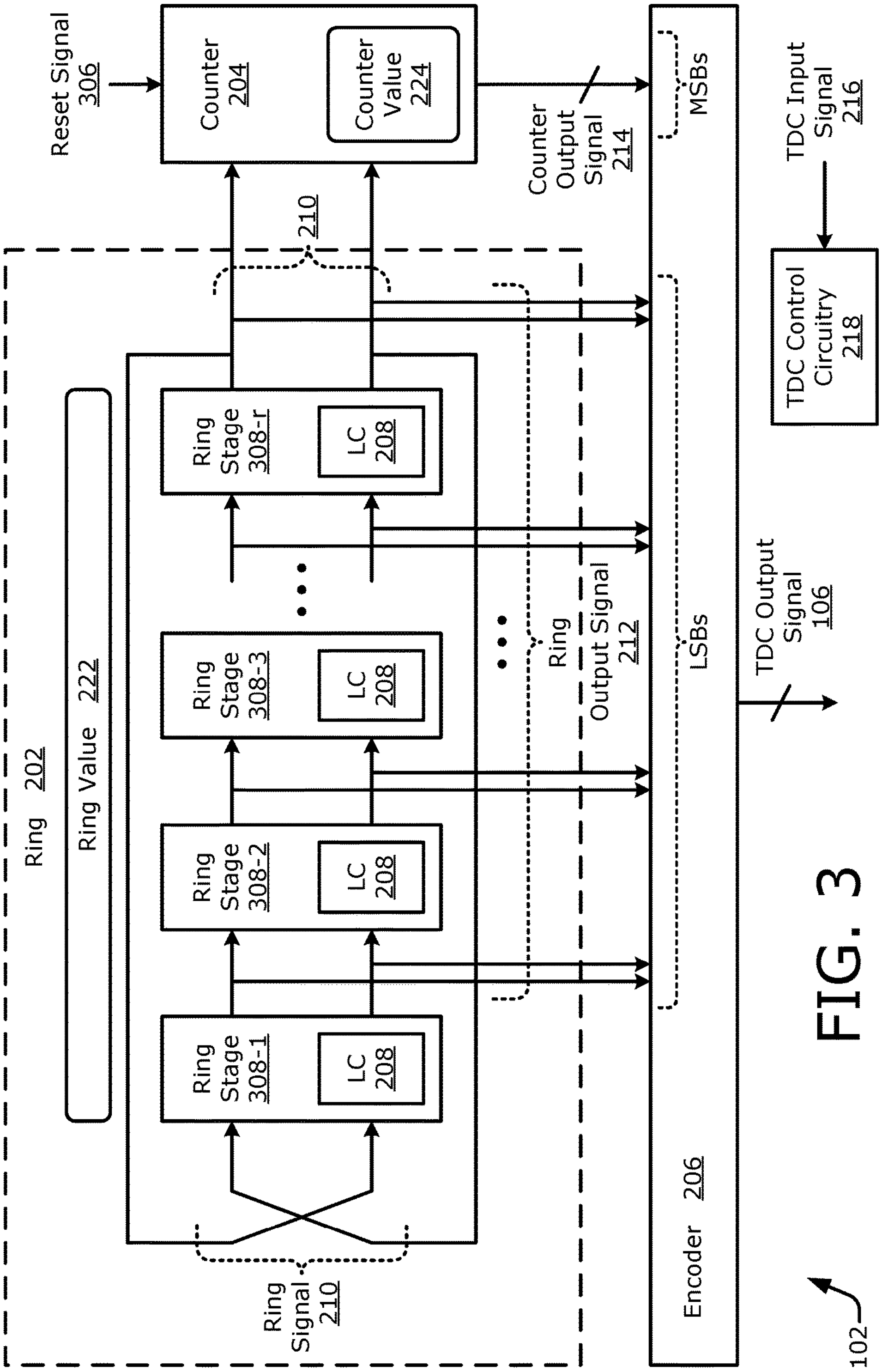
FIG. 3 is a schematic diagram illustrating an example TDC with a ring that includes multiple ring stages.

FIG. 3 is a schematic diagram illustrating an example TDC 102 with a ring 202 that includes multiple ring stages 308. The TDC 102 also includes the counter 204 and the encoder 206 and is associated with the TDC control circuitry 218. The ring 202 includes r ring stages 308-1, 308-2, 308-3 . . . **308-*r*, with r representing some positive integer, such as 4, 8, 12 or 19. Each respective ring stage 308 of the multiple ring stages 308-1, 308-2, 308-3 . . . 308-*r* includes respective latch circuitry 208 (LC). The multiple ring stages 308 collectively establish the ring value 222. The diagram depicts the TDC output signal 106, the ring signal 210, the ring output signal 212, the counter output signal 214, and the TDC input signal 216. The diagram also shows a reset signal 306 applied to the counter 204. The counter 204 increments and maintains the counter value 224**.

In the ring 202, the multiple ring stages 308 are connected in series along the ring 202. The multiple ring stages 308 are wired to form a loop for propagation of the ring signal 210 around the ring 202. Each ring stage 308 can be individually enabled or disabled, which is described with reference to FIGS. 4 and 5. The multiple ring stages 308 sequentially propagate the ring signal 210 over the ring 202 from the first ring stage 308-1 to the last ring stage **308-*r*. After the last ring stage 308-*r*, the ring signal 210 is routed back to the first ring stage 308-1 to continue the signal propagation and therefore operate the multiple ring stages 308 as a looped ring. The ring 202 can be operated as a ring oscillator in which the outputs of successive ring stages 308 have opposite voltage levels (e.g., high versus low). An example ring oscillator implementation is described below with reference to FIGS. 4 and 5. The output of each respective ring stage 308, which forms part of the ring signal 210, is secured by the respective latch circuitry 208**.

In example implementations, the ring signal 210 is realized as a signal having complementary voltage levels. Thus, two signaling lines couple successive or adjacent ring stages 308 one to another. The output of each ring stage 308 contributes two complementary-valued voltage levels toward the ring value 222. Each ring stage has first and second ring stage inputs and first and second ring stage outputs. The first and second ring stage outputs of each of the multiple ring stages 308-1, 308-2, 308-3 . . . **308-*r* establish an overall ring signal state that realizes the ring value 222. The ring value 222 is provided to the encoder 206 as the ring output signal 212 via the latch circuitry 208 of each ring stage 308. The output of the last ring stage 308-*r* is also coupled to the counter 204**.

The ring signal 210 triggers the counter 204 to increment the counter value 224. In other words, the counter 204 increments the counter value 224 responsive to a state change of the ring signal 210 that is output from the last ring stage **308-*r*. The counter 204 includes a reset input that is coupled to the reset signal 306. Responsive to activation of the reset signal 306, the counter 204 resets the counter value 224 (e.g., returns the counter value 224 to zero). The counter 204 provides the counter value 224 to the encoder 206 as the counter output signal 214. Because propagation of the ring signal 210 is disabled at the end of the duration 104, the counter 204** can be implemented with, for example, a high-speed ripple counter.

The encoder 206 receives the ring output signal 212 from the ring 202 and the counter output signal 214 from the counter 204. Thus, the encoder 206 obtains the ring value 222 from the ring 202 based on a latched state of the ring signal 210 and the counter value 224 from the counter 204. The encoder 206 generates the TDC output signal 106 based on the ring value 222 and the counter value 224. The encoder 206 encodes the ring value 222 as the least-significant-bits (LSBs) of the TDC output signal 106 and incorporates the counter value 224 as the most-significant-bits (MSBs) of the TDC output signal 106.

In operation, the TDC control circuitry 218 receives the TDC input signal 216 indicative of the duration 104 of the occurrence 118 that is to be timed. Responsive to activation of the TDC input signal 216, the TDC control circuitry 218 enables each of the multiple ring stages 308-1, 308-2, 308-3 . . . **308-*r* by providing an enable indication on a respective enable input of each ring stage 308. The TDC control circuitry 218 also drives the reset signal 306 active to cause the counter 204 to reset the counter value 224. Upon enablement, the ring 202 initiates propagation of the ring signal 210 across the multiple ring stages 308. The states of the ring signal 210 at the outputs of the multiple ring stages 308 oscillate from high to low between successive ring stages. Upon reaching the output of the last ring stage 308-*r*, the counter 204 increments the counter value 224 responsive to the ring signal 210. The ring 202 loops the ring signal 210 back to the first ring stage 308-1 and continues to propagate the ring signal 210 and increment the counter 204 through multiple ring cycles until the ring stages 308 are disabled by the TDC control circuitry 218**.

Responsive to deactivation of the TDC input signal 216, the TDC control circuitry 218 disables each of the multiple ring stages 308-1, 308-2, 308-3 . . . **308-*r* by providing a disable indication on the respective enable input of each ring stage 308 of the ring 202. This disabling terminates propagation of the ring signal 210. Even after the ring signal 210 ceases to propagate through the ring 202, the respective latch circuitry 208 of each respective ring stage 308 maintains the state of the respective ring stage 308 at the time the propagation of the ring signal 210** is disabled.

Figure 4:
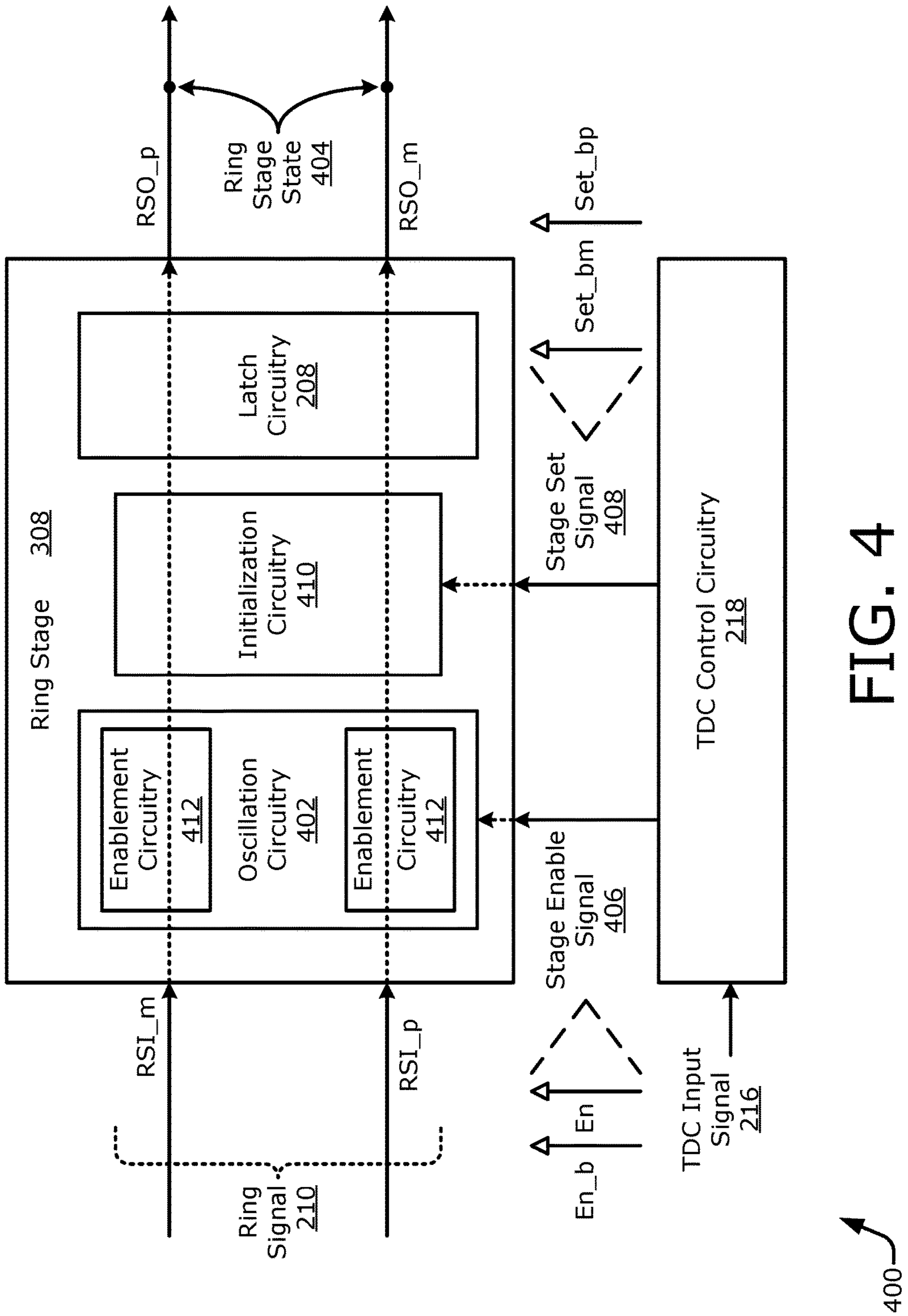
FIG. 4 illustrates an example ring stage at a relatively higher level in conjunction with associated TDC control circuitry.

FIG. 4 illustrates generally at 400 an example ring stage 308 at a relatively higher level in conjunction with associated TDC control circuitry 218. The ring stage 308 includes oscillation circuitry 402, initialization circuitry 410, and the latch circuitry 208. The oscillation circuitry 402 includes enablement circuitry 412. The TDC control circuitry 218 provides a stage enable signal 406 and a stage set signal 408. The ring stage 308 has a first ring stage input (RSI_m), a second ring stage input (RSI_p), a first ring stage output (RSO_p), and a second ring stage output (RSO_m). FIG. 4 also depicts a ring stage state 404. To implement the ring signal 210 as a complementary-valued signal, the two ring stage inputs have opposite voltage levels to each other, and the two ring stage outputs also have opposite voltage levels to each other.

The oscillation circuitry 402 causes the voltage levels of the ring signal 210 to oscillate between adjacent ring stages 308. For example, if the first ring stage input (RSI_m) has a high voltage level, the first ring stage output (RSO_p) has a low voltage level. Similarly, if the second ring stage input (RSI_p) has a low voltage level, the second ring stage output (RSO_m) has a high voltage level. To implement the oscillating signaling, the oscillation circuitry 402 can include two inverters that respectively invert the voltage levels between the two inputs and the two outputs. An example implementation of oscillation circuitry 402 that includes two inverters coupled in parallel to each other is described below with reference to FIG. 5.

The two outputs are latched by the latch circuitry 208. The ring stage state 404 includes a voltage level for at least one of the two outputs: the first ring stage output (RSO_p) or the second ring stage output (RSO_m). Thus, the latch circuitry 208 secures the ring stage state 404 for the ring stage 308. For example, the latch circuitry 208 maintains the ring stage state 404 after the oscillation circuitry 402 is disabled and the ring signal 210 ceases to propagate over the ring 202. Additionally or alternatively, the latch circuitry 208 enforces the complementary voltage levels of the ring signal 210 at the two outputs of the ring stage 308. To implement the latching to secure the ring stage state 404, the latch circuitry 208 can include a pair of cross-coupled inverters between the first ring stage output (RSO_p) and the second ring stage output (RSO_m). An example implementation of latch circuitry 208 that includes a pair of cross-coupled inverters is described below with reference to FIG. 6.

The initialization circuitry 410 sets at least one initial voltage level of the first ring stage output (RSO_p) or the second ring stage output (RSO_m) using the latch circuitry 208. The latch circuitry 208 can secure the initial voltage levels of the output of the ring stage 308 until the oscillation circuitry 402 is enabled. The enablement circuitry 412 enables the ring signal 210 to propagate through the ring stage 308 by permitting the ring signal 210 to pass through the oscillation circuitry 402. The enablement circuitry 412 disables propagation of the ring signal 210 through the ring stage 308 by blocking propagation of the ring signal 210 at the oscillation circuitry 402. Example implementations of the initialization circuitry 410 and the enablement circuitry 412 are described below with reference to FIG. 5.

The TDC control circuitry 218 controls operation of the enablement circuitry 412 and the initialization circuitry 410 using the stage enable signal 406 and the stage set signal 408, respectively. Multiple forms of these signals may be coupled to each ring stage 308. For example, the stage enable signal 406 can be coupled to the enablement circuitry 412 as an enablement signal (En) or an inverted enablement signal (En_b). The stage set signal 408 can be coupled to the initialization circuitry 410 as an inverted set signal for the first output (Set_bp) or an inverted set signal for the second output (Set_bm). Application of these signals is described further below.

Figure 5:
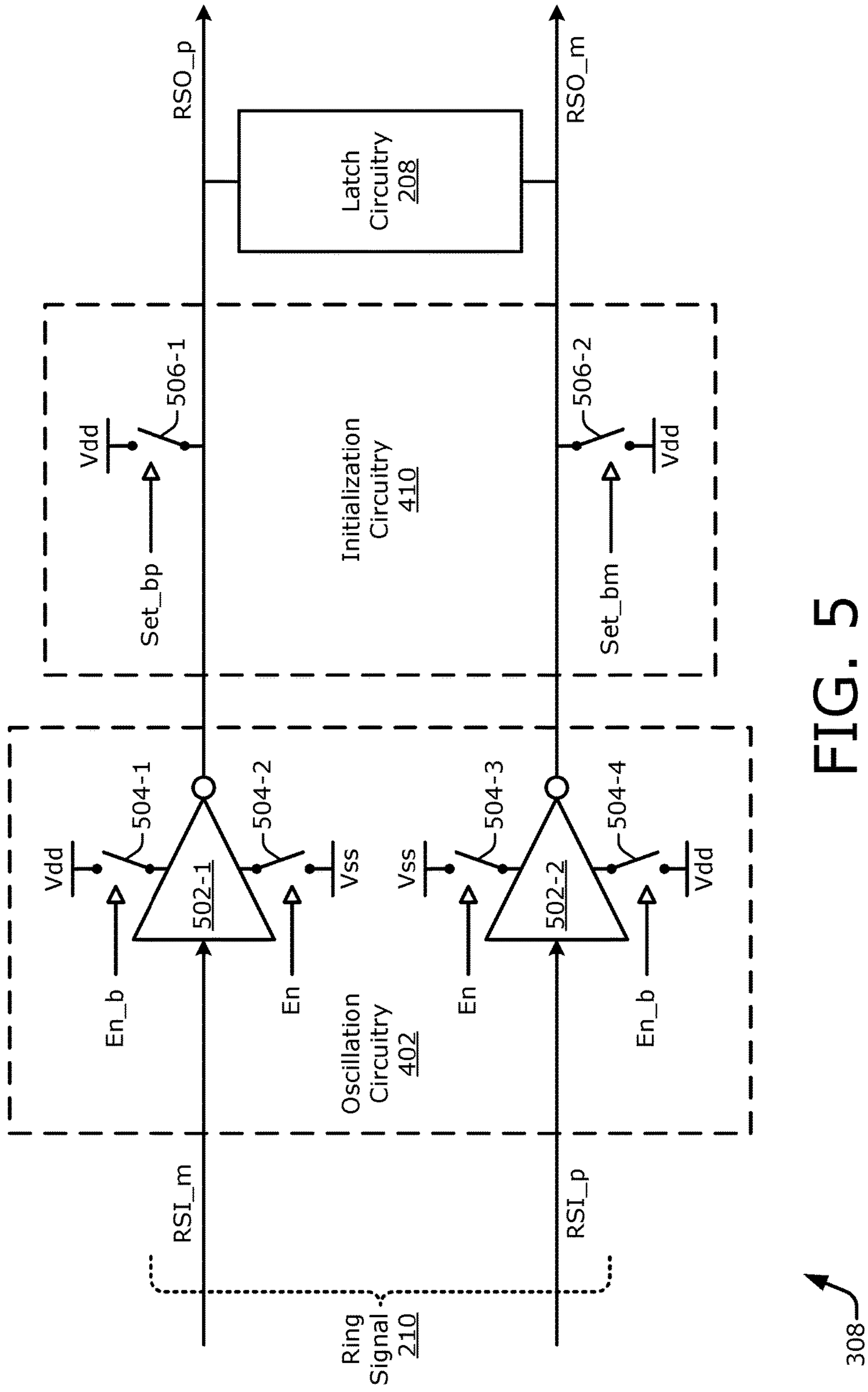
FIG. 5 illustrates an example of a ring stage at a relatively lower level that includes latch circuitry coupled across first and second outputs.

FIG. 5 illustrates an example of a ring stage 308 at a relatively lower level that depicts latch circuitry 208 coupled across the first and second outputs of the ring stage 308. As shown, the latch circuitry 208 is coupled between the first ring stage output (RSO_p) and the second ring stage output (RSO_m) such that the ring signal 210 propagates through the latch circuitry 208 to a succeeding ring stage 308. As shown with dashed rectangles, the example ring stage 308 also illustrates the oscillation circuitry 402 and the initialization circuitry 410. Example circuit device structures for the oscillation circuitry 402 and the initialization circuitry 410 are described here with reference to FIG. 5.

The example oscillation circuitry 402 includes a first inverter 502-1 and a second inverter 502-2. The enablement circuitry 412 (as shown in FIG. 4) of the oscillation circuitry 402 includes a first enablement switch 504-1, a second enablement switch 504-2, a third enablement switch 504-3, and a fourth enablement switch 504-4. The example initialization circuitry 410 includes a first initialization switch 506-1 and a second initialization switch 506-2. The inverters and the switches can be implemented using one or more transistors. Example transistor implementations are described below with reference to FIGS. 7 and 8. FIG. 5 also depicts an indication of a power rail that is held at a relatively higher voltage level (Vdd) and an indication of a power rail that is held at a relatively lower voltage level (Vss). Vdd and Vss may both be positive voltages, both be negative voltages, have a positive and a negative voltage, and so forth. For example, Vdd can represent a positive voltage, and Vss can represent a ground potential.

In the oscillation circuitry 402, the first inverter 502-1 and the second inverter 502-2 are coupled in parallel with respect to each other and are aligned along the direction of propagation of the ring signal 210. The first inverter 502-1 is coupled between the first ring stage input (RSI_m) and the first ring stage output (RSO_p). The second inverter 502-2 is coupled between the second ring stage input (RSI_p) and the second ring stage output (RSO_m). The first inverter 502-1 and the second inverter 502-2 therefore invert respective voltage levels of the ring signal 210 as the complementary-valued voltage levels of the ring signal 210 propagate through the ring stage 308.

The first enablement switch 504-1 and the fourth enablement switch 504-4 are coupled between the relatively higher voltage level power rail (Vdd) and the first inverter 502-1 and the second inverter 502-2, respectively. The first enablement switch 504-1 and the fourth enablement switch 504-4 are controlled by the inverted enablement signal (En_b). The second enablement switch 504-2 and the third enablement switch 504-3 are coupled between the relatively lower voltage level power rail (Vss) and the first inverter 502-1 and the second inverter 502-2, respectively. The second enablement switch 504-2 and the third enablement switch 504-3 are controlled with the enablement signal (En).

In operation, the TDC control circuitry 218 of FIG. 4 provides the inverted enablement signal (En_b) and the enablement signal (En) such that the four switches are closed during enablement periods and open during disablement periods. Responsive to being closed, the first enablement switch 504-1, the second enablement switch 504-2, the third enablement switch 504-3, and the fourth enablement switch 504-4 function as voltage-pulling switches to pull adjoining nodes toward a voltage level of a respective power rail to which the switch is coupled (e.g., pulling a voltage up toward Vdd or pulling a voltage down toward Vss). Some switches, however, may remain open during an enablement period to change the temporal resolution of the ring 202. Example implementations with a programmable resolution are described with reference to FIG. 10.

In the initialization circuitry 410, the first initialization switch 506-1 is coupled between the relatively higher voltage level power rail (Vdd) and the first ring stage output (RSO_p). To set the first ring stage output (RSO_p) to a high voltage level, the TDC control circuitry 218 provides the inverted set signal for the first output (Set_bp) such that the first initialization switch 506-1 is closed. The second initialization switch 506-2 is coupled between the relatively higher voltage level power rail (Vdd) and the second ring stage output (RSO_m). To set the second ring stage output (RSO_m) to a high voltage level, the TDC control circuitry 218 provides the inverted set signal for the second output (Set_bm) such that the second initialization switch 506-2 is closed. Extending across a series of ring stages 308 for the ring 202, the TDC control circuitry 218 can close opposite initialization switches 506 in consecutive ring stages 308 so that an initial version of the ring value 222 has alternating voltage levels along successive ring stages 308.

Figure 6:
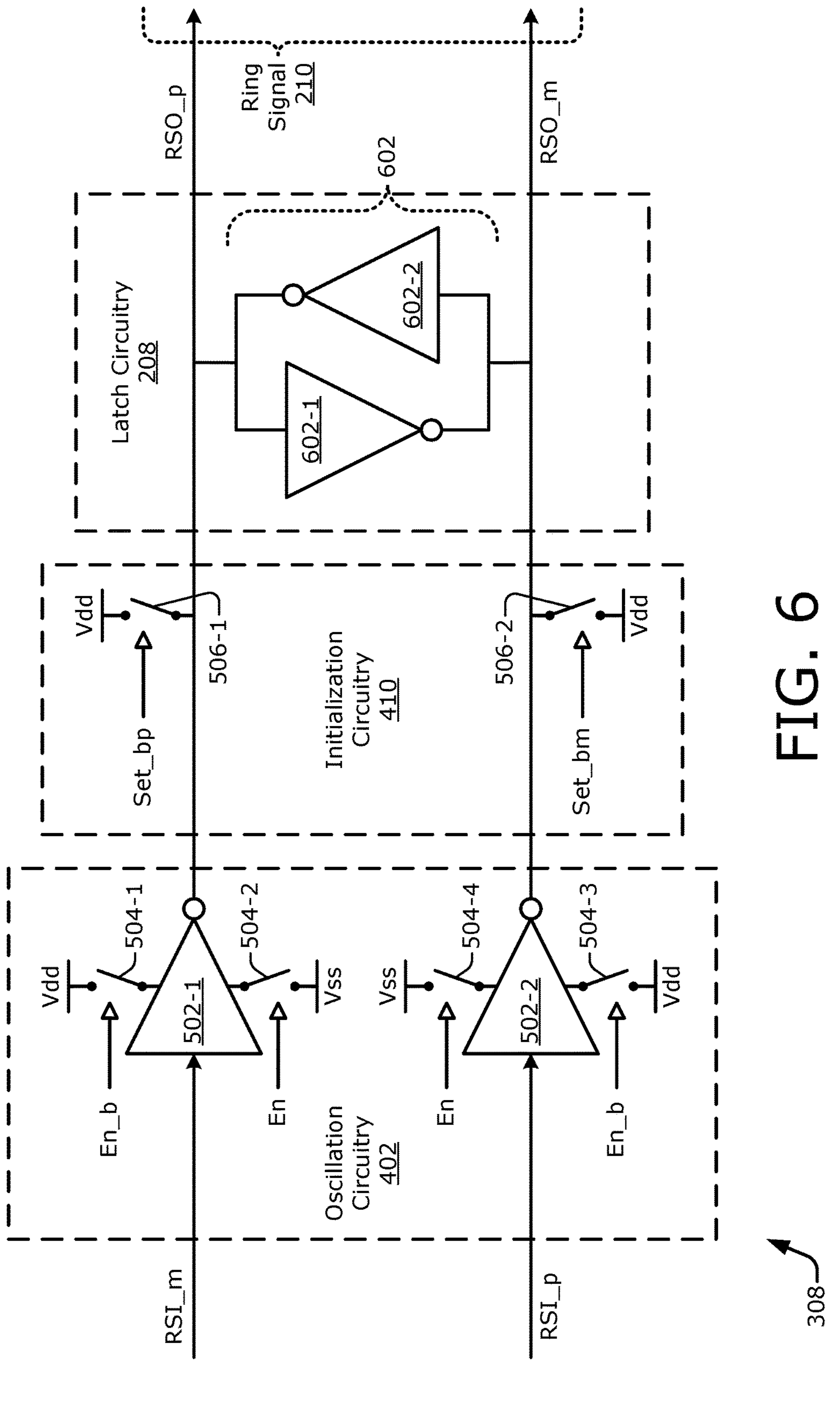
FIG. 6 illustrates another example of a ring stage at a relatively lower level that depicts the latch circuitry implemented with a pair of inverters.

FIG. 6 illustrates another example of a ring stage 308 at a relatively lower level that depicts the latch circuitry 208 as being implemented with a pair of inverters. Specifically, the latch circuitry 208 includes a pair of cross-coupled inverters 602. The pair of cross-coupled inverters 602 are coupled in parallel with respect to each other across the first ring stage output (RSO_p) and the second ring stage output (RSO_m). A first latching inverter 602-1 is coupled between the first ring stage output (RSO_p) and the second ring stage output (RSO_m) in one direction—e.g., pointing from the first ring stage output (RSO_p) to the second ring stage output (RSO_m). A second latching inverter 602-2 is coupled between the second ring stage output (RSO_m) and the first ring stage output (RSO_p) in an opposite direction—e.g., pointing from the second ring stage output (RSO_m) to the first ring stage output (RSO_p).

In operation, the first latching inverter 602-1 causes the voltages of the first ring stage output (RSO_p) and the second ring stage output (RSO_m) to have opposite voltage levels. Similarly, the second latching inverter 602-2 causes the voltages of the second ring stage output (RSO_m) and the first ring stage output (RSO_p) to have opposite voltage levels. The pair of cross-coupled inverters 602 therefore enforce the complementary voltage levels of the ring signal 210. Furthermore, the pair of cross-coupled inverters 602 maintain complementary voltage levels at the first ring stage output (RSO_p) and the second ring stage output (RSO_m) after the ring signal 210 ceases to propagate over the ring 202.

Figure 7:
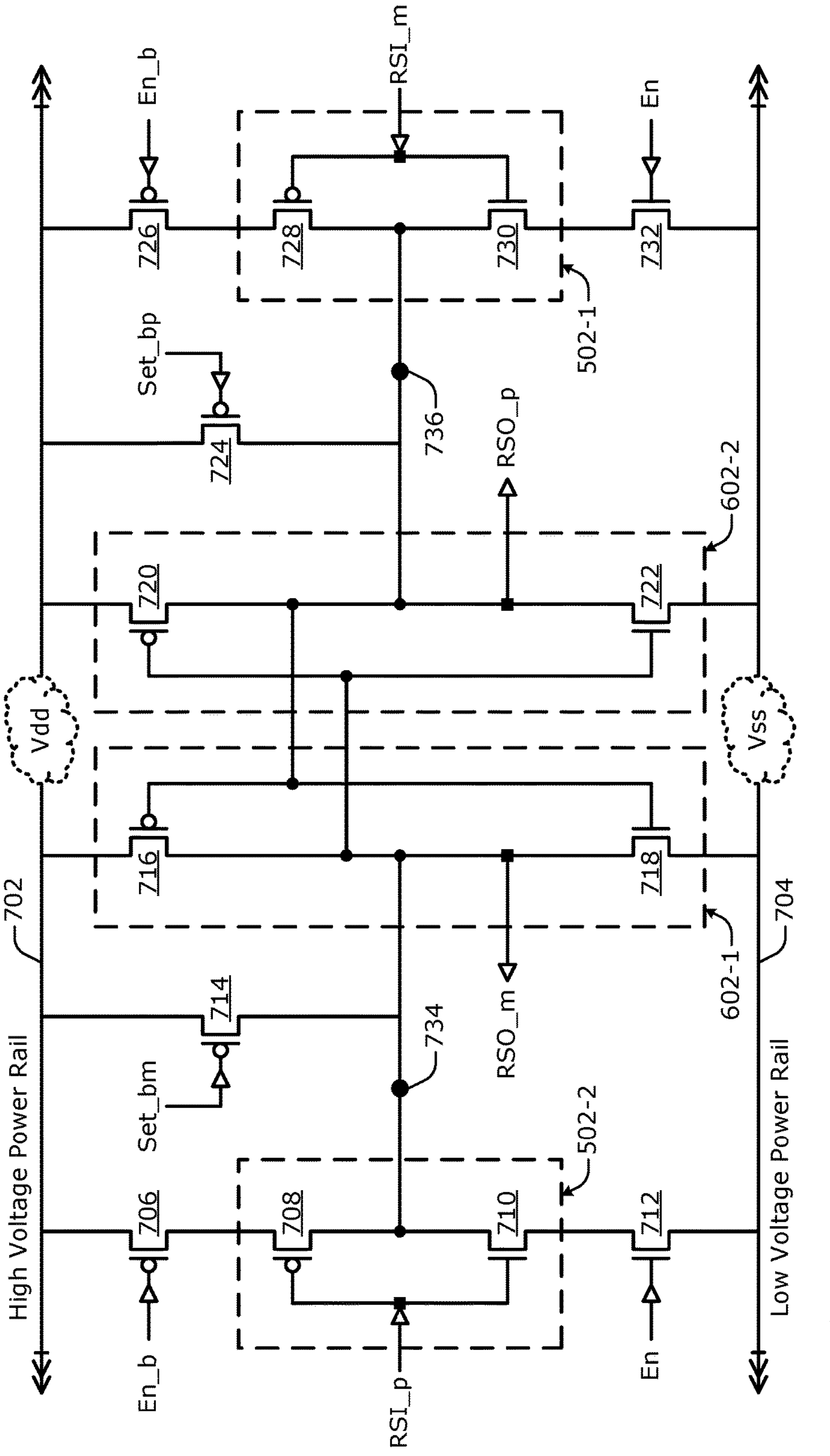
FIG. 7 illustrates an example of a ring stage at a transistor level.

FIG. 7 illustrates an example of a ring stage 308 at a transistor level. In other words, the ring stage 308 of FIG. 7 depicts an example implementation of the ring stage 308 of FIG. 6. Accordingly, the transistors of FIG. 7 are described with reference to the corresponding logical circuit devices of FIG. 6. The ring stage 308 includes the first ring stage input (RSI_m), the second ring stage input (RSI_p), the first ring stage output (RSO_p), and the second ring stage output (RSO_m). The ring stage 308 accepts the following control signals: the enablement signal (En), the inverted enablement signal (En_b), the inverted set signal for the first output (Set_bp), and the inverted set signal for the second output (Set_bm).

The ring stage 308 is powered by a high voltage power rail 702 (Vdd) and a low voltage power rail 704 (Vss). The transistors of the ring stage 308 are coupled between these two power rails. The ring stage 308 includes 14 transistors. There are eight p-type transistors: a transistor 706, a transistor 708, a transistor 714, a transistor 716, a transistor 720, a transistor 724, a transistor 726, and a transistor 728. There are also six n-type transistors: a transistor 710, a transistor 712, a transistor 718, a transistor 722, a transistor 730, and a transistor 732.

On the right, the transistor 726 corresponds to the first enablement switch 504-1, and the transistor 732 corresponds to the second enablement switch 504-2. The transistor 728 and the transistor 730 jointly correspond to the first inverter 502-1. The transistor 724 corresponds to the first initialization switch 506-1. The transistor 716 and the transistor 718 jointly correspond to the first latching inverter 602-1. On the left, the transistor 706 corresponds to the fourth enablement switch 504-4, and the transistor 712 corresponds to the third enablement switch 504-3. The transistor 708 and the transistor 710 jointly correspond to the second inverter 502-2. The transistor 714 corresponds to the second initialization switch 506-2. The transistor 720 and the transistor 722 jointly correspond to the second latching inverter 602-2.

Between the high voltage power rail 702 and to the low voltage power rail 704, on the left side of FIG. 7, the following four transistors are coupled in series starting from the high voltage power rail 702: the transistor 706, the transistor 708, the transistor 710, and the transistor 712. The transistor 706 has a gate coupled to the inverted enablement signal (En_b). The transistor 712 has a gate coupled to the enablement signal (En). The two gates of the transistor 708 and the transistor 710 are coupled together to form the second ring stage input (RSI_p), which corresponds to the input to the second inverter 502-2. A node 734 between the transistor 708 and the transistor 710 serves as the output of the second inverter 502-2. The transistor 714 is coupled between the high voltage power rail 702 and the node 734 that is between the transistor 708 and the transistor 710. A gate of the transistor 714 is coupled to the inverted set signal for the second output (Set_bm).

Also between the high voltage power rail 702 and the low voltage power rail 704, the following two transistors are coupled in series starting from the high voltage power rail 702: the transistor 720 and the transistor 722. The two gates of the transistor 720 and the transistor 722 are coupled together to form the input to the second latching inverter 602-2, which is also the node 734 between the transistor 708 and the transistor 710, as well as the second ring stage output (RSO_m). A node 736 between the transistor 720 and the transistor 722 serves as the output of the second latching inverter 602-2 and corresponds to the first ring stage output (RSO_p). The right side of FIG. 7 is a mirror image of the above-described left side, but the illustrated transistors pertain to the first ring stage input (RSI_m) and the first ring stage output (RSO_p).

In operation, for the left side of FIG. 7, half of the ring signal 210 can propagate across the ring stage 308 from the second ring stage input (RSI_p) to the second ring stage output (RSO_m) if the second inverter 502-2 is enabled. The transistor 708 and the transistor 710 are enabled to function as an inverter if at least one of the transistor 706 or the transistor 712 is turned on. The transistor 706 or the transistor 712 being turned on corresponds to a closed state of the third enablement switch 504-3 or the fourth enablement switch 504-4, respectively. Example control signaling to operate the enablement switches as implemented in FIG. 7 is described with reference to FIG. 9.

Figure 8:
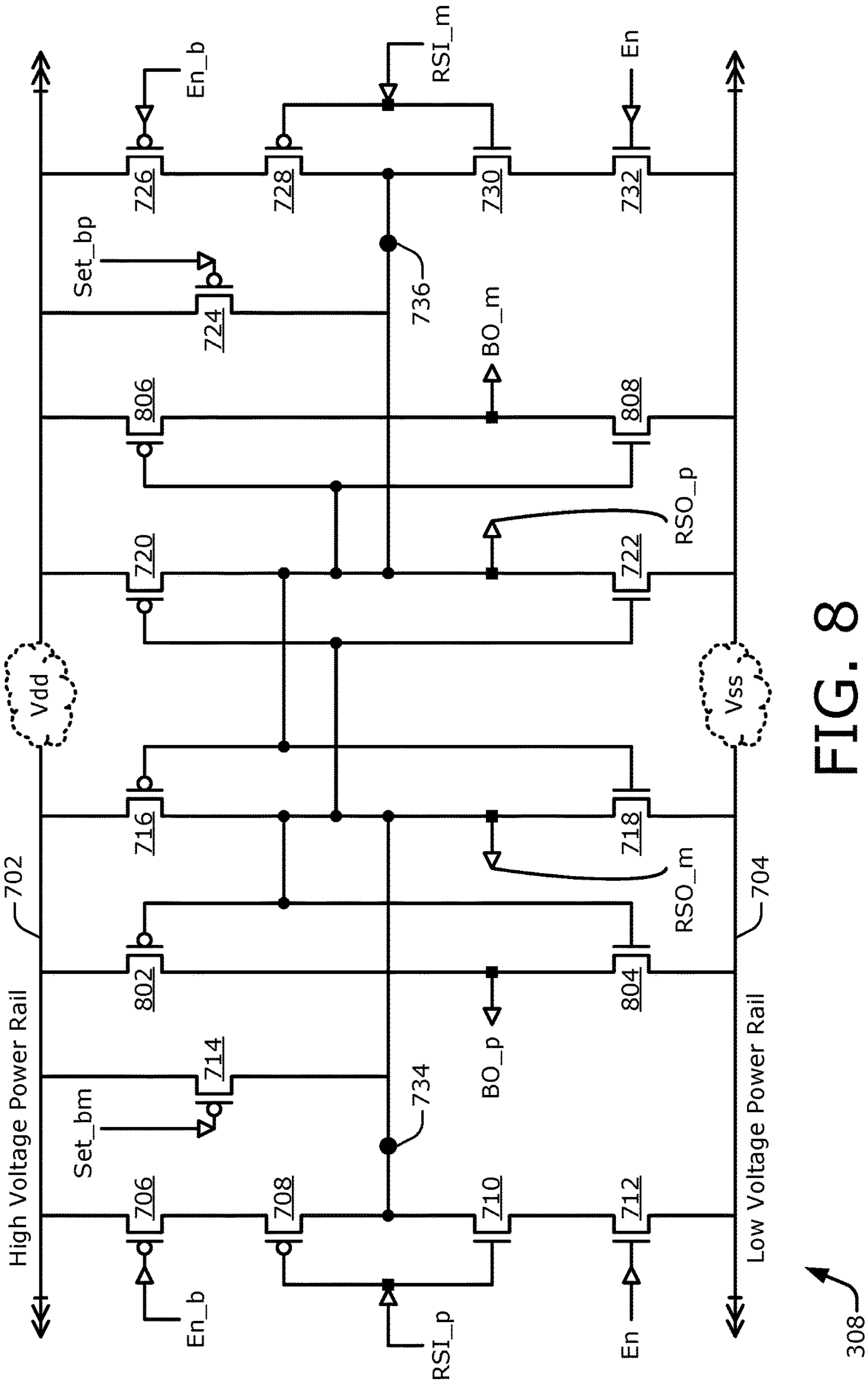
FIG. 8 illustrates another example of a ring stage at the transistor level that includes output buffers.

FIG. 8 illustrates another example of a ring stage 308 at the transistor level that includes output buffers. The ring stage 308 of FIG. 8 is similar to the ring stage 308 of FIG. 7. However, two output buffers are depicted for the ring stage 308 of FIG. 8. Thus, FIG. 8 includes four additional transistors. There are two additional p-type transistors: a transistor 802 and a transistor 806. There are also two additional n-type transistors: a transistor 804 and a transistor 808. Between the high voltage power rail 702 and the low voltage power rail 704, the following two transistors are coupled in series starting from the high voltage power rail 702: the transistor 802 and the transistor 804. The two gates of the transistor 802 and the transistor 804 are coupled together at the node 734 that is also co-located between the transistor 708 and the transistor 710, which corresponds to the second ring stage output (RSO_m).

A node between the transistor 802 and the transistor 804 serves as a second buffer output (BO_p). The transistor 802 and the transistor 804 therefore form a second output buffer that inverts the voltage level of the second ring stage output (RSO_m). On the right side of FIG. 8, the transistor 806 and the transistor 808 correspond respectively to the transistor 802 and the transistor 804. Thus, a node between the transistor 806 and the transistor 808 serves as a first buffer output (BO_m). The transistor 806 and the transistor 808 therefore form a first output buffer that inverts the voltage level of the first ring stage output (RSO_p). In this implementation, the voltage levels of the first buffer output (BO_m) and the second buffer output (BO_p) are provided to the encoder 206 as the ring output signal 212 (both of FIGS. 2 and 3).

This circuitry also demonstrates three aspects of the latch circuitry 208, which is realized using the first latching inverter 602-1 and the second latching inverter 602-2. First, the latch circuitry 208 participates in or affects the propagation of the ring signal 210 across the ring 202. Second, the latch circuitry 208 possesses voltage levels representative of the ring value 222 during the timing of the duration 104 as the ring signal 210 propagates around the ring 202, and not merely upon the conclusion of the timing. Third, the ring 202 provides the ring value 222 as the ring output signal 212 via the latch circuitry 208 by way of output buffers. Although a single output buffer may be used instead of the mirrored pair illustrated in FIG. 9, implementing the mirrored pair of buffers balances the circuitry.

Figure 9:
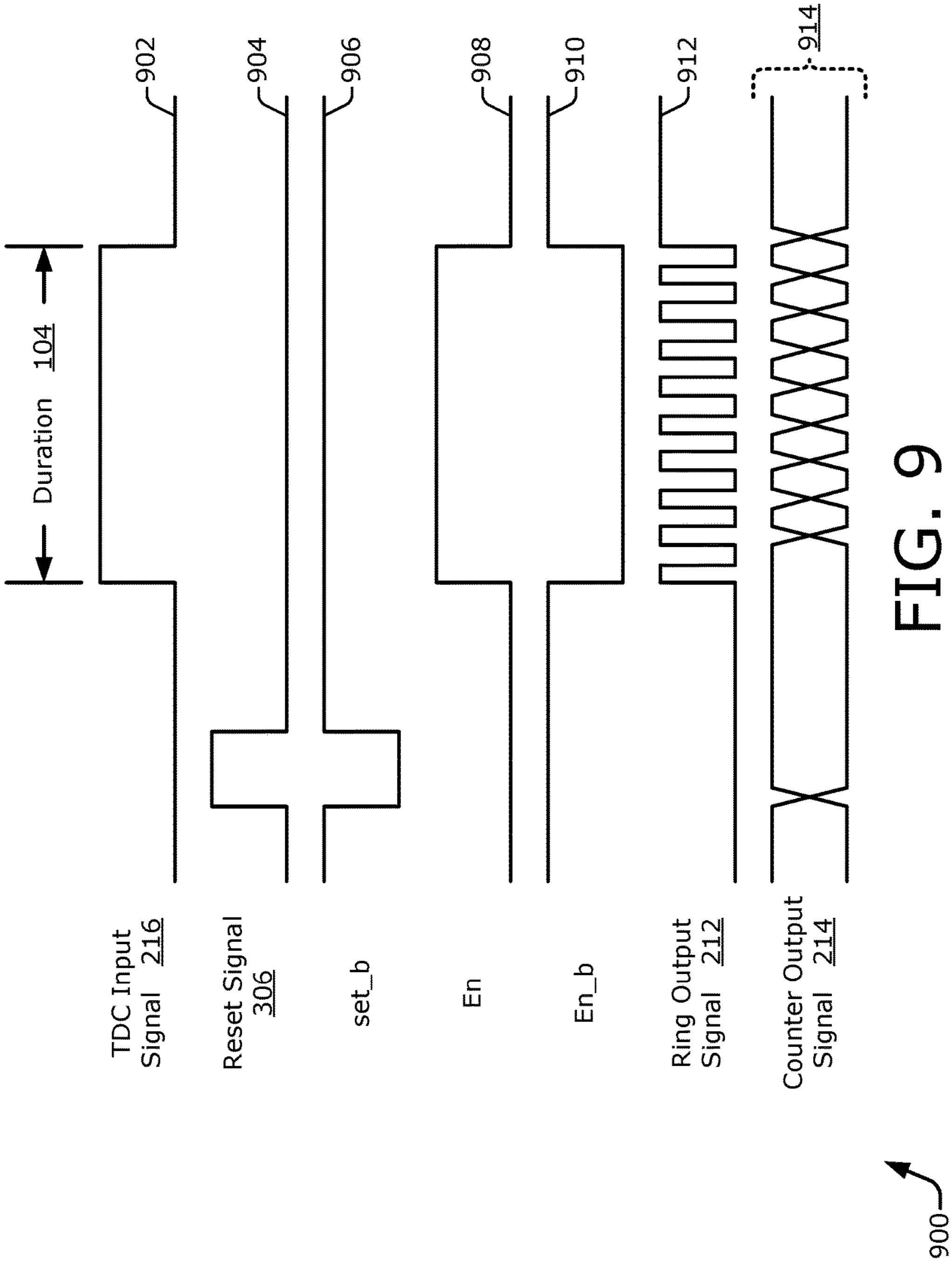
FIG. 9 illustrates an example signal timing diagram for operation of a TDC.

FIG. 9 illustrates an example signal timing diagram 900 for operation of a TDC 102. The signal waveforms depicted in FIG. 9 can operate a TDC 102 having ring stages 308 as shown in FIGS. 4 and 6 that are implemented using the transistor arrangements of FIG. 7. Seven signal waveforms 902-914 are shown. The signal waveform 902 corresponds to the TDC input signal 216 and indicates a duration 104 with an active high voltage level. Prior to the beginning of the duration 104, the TDC control circuitry 218 prepares the counter 204 and the ring 202 of the TDC 102. The signal waveform 904 corresponds to the reset signal 306 and depicts an active high pulse that resets the counter value 224 of the counter 204. The signal waveform 906 corresponds to the inverted set signal (set_b) for the outputs of the ring stages 308-1, 308-2, 308-3 . . . **308-*r*, such as the inverted set signal for the first output (Set_bp) or the inverted set signal for the second output (Set_bm). As described above, alternating first and second outputs are set at consecutive ring stages 308 to establish an initial ring value 222 along the ring 202**.

The signal waveform 908 corresponds to the enablement signal (En), which is active high in this example. The enablement signal (En) is applied to the gates of the n-type transistor 712 and the n-type transistor 732 to turn these transistors on during the duration 104. The signal waveform 910 corresponds to the inverted enablement signal (En_b), which is active low in this example. The inverted enablement signal (En_b) is applied to the gates of the p-type transistor 706 and the p-type transistor 726 to turn these transistors on during the duration 104. Thus, the TDC control circuitry 218 controls the enablement signal (En) and the inverted enablement signal (En_b) to enable the first inverter 502-1 (e.g., the transistor 728 and the transistor 730) and the second inverter 502-2 (e.g., the transistor 708 and the transistor 710) to be active and to propagate an oscillating version of the ring signal 210 through the ring stage 308 while the TDC input signal 216 is active.

The oscillating version of the ring signal 210 is therefore present along the ring 202 as the ring value 222. The ring 202 provides this ring value 222 having alternating high and low voltage levels as the ring output signal 212. The illustrated signal waveform 912 corresponds to such a ring output signal 212 for the duration 104. Each time an oscillation cycle propagates through the multiple ring stages 308-1, 308-2, 308-3 . . . **308-*r*, the state of the final ring stage 308-*r* changes. The change of the state of the final ring stage 308-*r* triggers the counter 204 so that the counter 204 increments the counter value 224. An example for the counter output signal 214, which reflects changes to the counter value 224, is depicted by the signal waveform 914. Initially, the counter value 224 changes responsive to the reset signal 306 as depicted by the signal waveform 904. The counter value 224 also changes while the ring signal 210 is oscillating as depicted by the signal waveform 912, which is representative of the ring output signal 212. The counter value 224 becomes constant after the propagation of the ring signal 210 ceases, as depicted by the signal waveform 914**.

Figure 10:
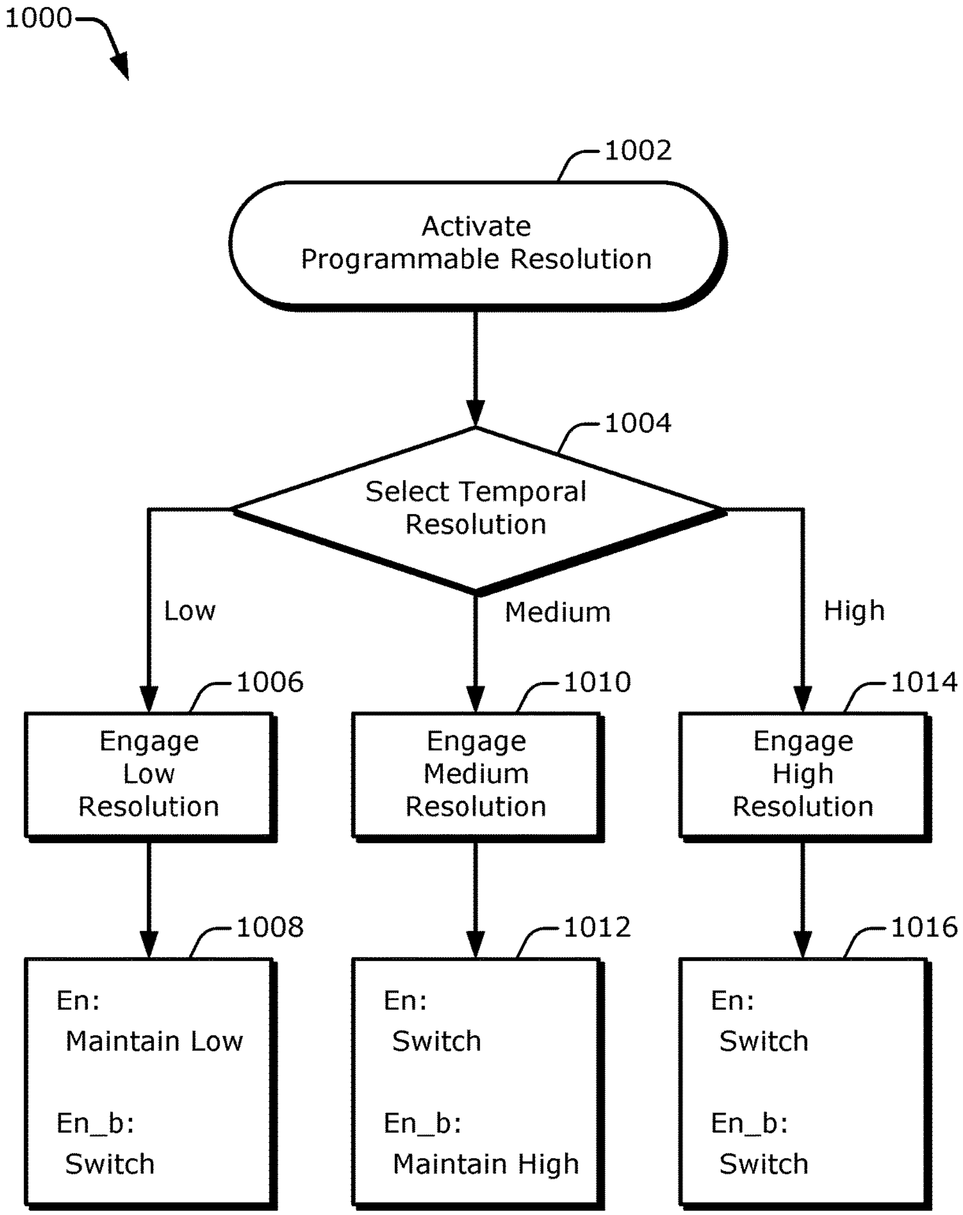
FIG. 10 is a flow diagram illustrating an example process for implementing a programmable resolution with a TDC as described herein.
Figure 11:
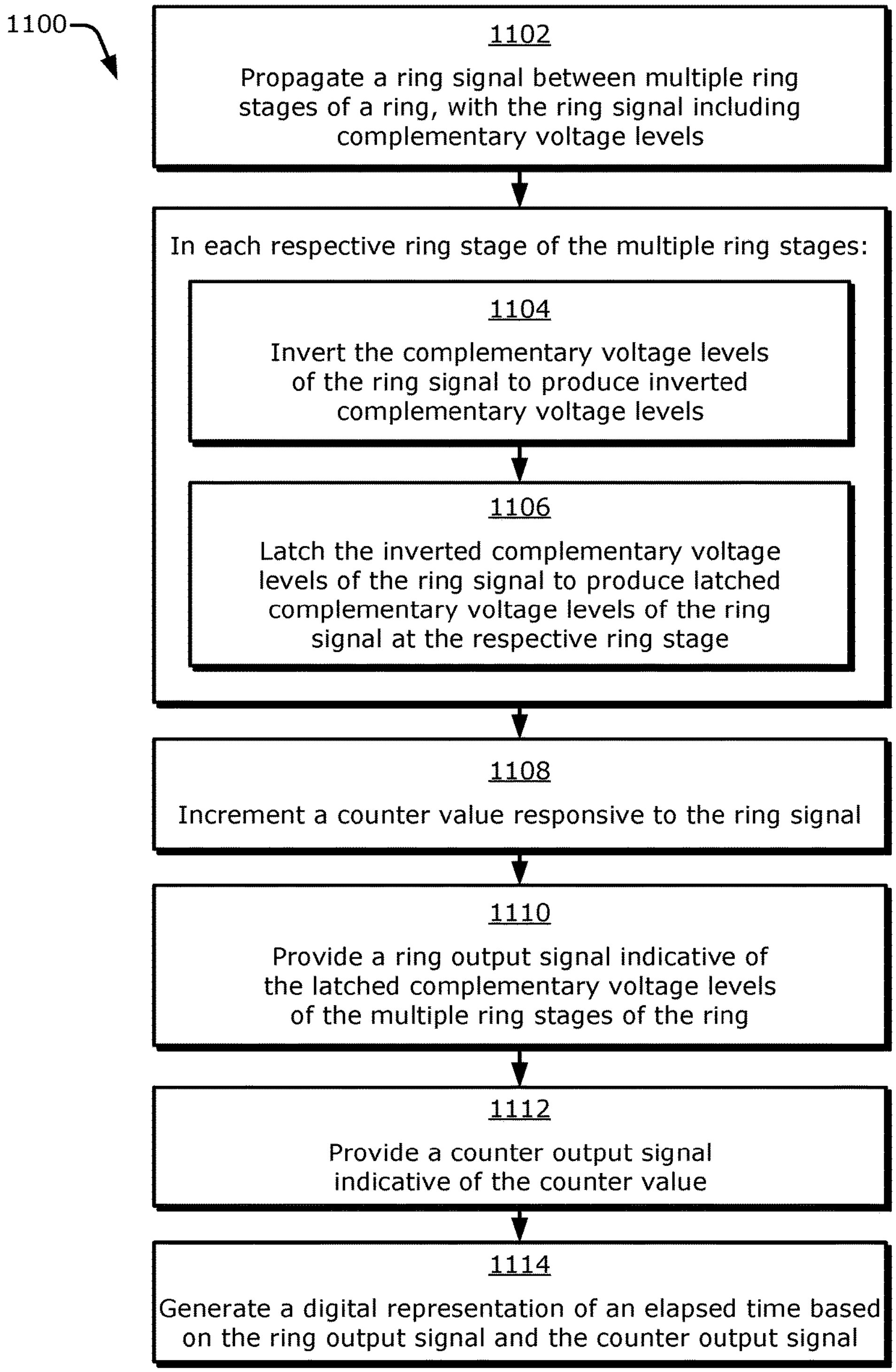
FIG. 11 is a flow diagram illustrating an example process for time-to-digital conversion with a latch-based ring.

FIGS. 10-11 depict flow diagrams directed to various aspects of time-to-digital conversion with a latch-based ring. These flow diagrams are illustrated in the drawings and described herein using multiple blocks that indicate operations that may be performed or states that may be taken by an integrated circuit. However, occurrence of the operations and states are not necessarily limited to the orders illustrated in FIGS. 10-11 or described herein, for the operations and states may be implemented in alternative orders or in fully or partially overlapping manners.

FIG. 10 is a flow diagram illustrating an example process 1000 for implementing a programmable resolution with a ring 202 of a TDC 102. The process 1000 is described in terms of a set blocks 1002-1016, with each block representative of at least one operation. The process 1000 can be performed by, for example, the TDC control circuitry 218. As shown in FIG. 7, there are four enablement-oriented transistors per ring stage 308. The two p-type transistors are the transistor 706 and the transistor 726. The two n-type transistors are the transistor 712 and the transistor 732. These four transistors can be fabricated to have the same size.

Alternatively, these four transistors can be fabricated to have two different sizes to create a TDC 102 having a programmable temporal resolution, even under a constant supply voltage level. In other words, an amount of time that elapses as the ring signal 210 propagates through an individual ring stage 308 can be made to be adjustable even while the supply voltages remain unchanged. The adjustability results from using asymmetric sizes of the p-type versus the n-type transistors (e.g., a different p-type metal-oxide-semiconductor (PMOS) size versus an n-type metal-oxide-semiconductor (NMOS) size in the enablement-oriented transistors). In an example implementation, the pull-down transistors operate more quickly than the pull-up transistors. Thus, the transistor 712 and the transistor 732 operate more quickly than the transistor 706 and the transistor 726. This enables three different relative temporal resolutions: low, medium, and high.

With reference to the flow diagram of the process 1000, the TDC 102 can be operated at the high temporal resolution, which has been described herein above with reference to FIGS. 7 and 9. If the high resolution is engaged at block 1014, the TDC control circuitry 218 switches the enablement signal (En) and the inverted enablement signal (En_b) as shown in FIG. 9. This is indicated at block 1016. However, as shown at block 1002, a programmable resolution feature can be activated. For example, a decision can be made to switch to a low or a medium temporal resolution for the ring 202 of the TDC 102. Lower temporal resolutions can reduce power consumption. At block 1004, a temporal resolution is selected. The three example temporal resolutions are low, medium, and high from left to right. Generally, the programmable resolution for the ring 202 is implemented by enabling one voltage-pulling switch and disabling another voltage-pulling switch of the first enablement switch 504-1, the second enablement switch 504-2, the third enablement switch 504-3, and the enablement switch 504-4.

At block 1006, the low resolution is engaged. To implement the low resolution at block 1008, the TDC control circuitry 218 maintains the enablement signal (En) at a low voltage level and switches the inverted enablement signal (En_b) as shown in FIG. 9. Because the pull-up effect occurs more slowly than the pull-down effect in this example, the ring signal 210 propagates more slowly through the ring 202, which lowers the temporal resolution of the TDC 102.

At block 1010, the medium resolution is engaged instead. To implement the medium resolution at block 1012, the TDC control circuitry 218 maintains the inverted enablement signal (En_b) at a high voltage level and switches the enablement signal (En) as shown in FIG. 9. Because the pull-down effect occurs more quickly than the pull-up effect in this example, the ring signal 210 propagates more quickly through the ring 202 as compared to the speed at the low resolution. This therefore increases the temporal resolution of the TDC 102 to the medium resolution.

FIG. 11 is a flow diagram illustrating an example process 1100 for time-to-digital conversion with a latch-based ring. The process 1100 is described in terms of a set blocks 1102-1114, with each block representative of at least one operation. The operations may be performed by an integrated circuit, such as an integrated circuit 1210 of FIG. 12, which is described below. More specifically, the operations of the process 1100 may be performed by a TDC 102 of FIGS. 1-3.

At block 1102, a ring signal is propagated between multiple ring stages of a ring, with the ring signal including complementary voltage levels. For example, the TDC 102 can propagate a ring signal 210 between multiple ring stages 308 of a ring 202, with the ring signal 210 including complementary voltage levels. Thus, the ring signal 210 may take on a high voltage level and a low voltage level at each ring stage 308.

The operations of blocks 1104 and 1106 are performed in each respective ring stage 308 of the multiple ring stages 308. At block 1104, the complementary voltage levels of the ring signal are inverted to produce inverted complementary voltage levels. For example, the TDC 102 can invert the complementary voltage levels of the ring signal 210 to produce inverted complementary voltage levels (e.g., voltage levels that swap high for low and low for high). To do so, oscillation circuitry 402 in each ring stage 308 may route the ring signal 210 through a first inverter 502-1 and a second inverter 502-2 that are arranged in parallel to each other and aligned with the direction of propagation of the ring signal 210 along the ring 202.

At block 1106, the inverted complementary voltage levels of the ring signal are latched to produce latched complementary voltage levels of the ring signal at the respective ring stage. For example, the TDC 102 can latch the inverted complementary voltage levels of the ring signal 210 to produce latched complementary voltage levels of the ring signal 210 at the respective ring stage 308. For instance, latch circuitry 208 in each ring stage 308 may secure the ring stage state 404 of the first ring stage output (RSO_p) and the second ring stage output (RSO_m).

At block 1108, a counter value is incremented responsive to the ring signal. For example, the TDC 102 can increment a counter value 224 responsive to the ring signal 210. Responsive to a state change of the outputs of a last ring stage 308-*r*, a counter 204 may increase the counter value 224 by one.

At block 1110, a ring output signal indicative of the latched complementary voltage levels of the multiple ring stages of the ring is provided. For example, the TDC 102 can provide a ring output signal 212 indicative of the latched complementary voltage levels of the multiple ring stages 308 of the ring 202. More specifically, the ring 202 may make available on buffer outputs of each respective ring stage 308 the high and low voltage levels that are maintained by the latch circuitry 208 as the ring value 222.

At block 1112, a counter output signal indicative of the counter value is provided. For example, the TDC 102 can provide a counter output signal 214 indicative of the counter value 224. Without using flip-flops, the counter 204 may present to an encoder 206 the voltages representative of the counter value 224 as the counter output signal 214.

At block 1114, a digital representation of an elapsed time is generated based on the ring output signal and the counter output signal. For example, the TDC 102 can generate a digital representation of an elapsed time based on the ring output signal 212 and the counter output signal 214. For instance, the encoder 206 may encode the ring value 222 from the ring output signal 212 and incorporate the counter value 224 from the counter output signal 214 into the TDC output signal 106 having voltage levels that correspond to a binary numeral that characterizes a duration 104 of some occurrence 118.

Example implementations of the process 1100 can further include an operation of initiating the propagating of the ring signal responsive to an initiating event corresponding to the elapsed time and terminating the propagating of the ring signal responsive to a terminating event corresponding to the elapsed time. For instance, the propagating of the ring signal 210 can be initiated responsive to an initiating event 114 corresponding to the occurrence 118, and the propagating of the ring signal 210 can be terminated responsive to a terminating event 116 corresponding to the occurrence 118.

Example implementations of the process 1100 can further include an operation of initially setting a voltage level of the complementary voltage levels of alternating outputs of the multiple ring stages along the ring. For instance, a voltage level of the complementary voltage levels can initially be set at alternating outputs (e.g., at the first ring stage output (RSO_p) and then at the second ring stage output (RSO_m), and then again at the first ring stage output (RSO_p)) of consecutive or adjacent ones of the multiple ring stages 308 along the ring 202.

Example implementations for the latching operation of the block 1106 can further include enforcing complementary values (e.g., a high voltage level and a low voltage level) of the inverted complementary voltage levels as the ring signal 210 is propagated over the ring 202. Additionally or alternatively, the latched complementary voltage levels can be maintained after the propagating of the ring signal 210 is terminated. The enforcing or the maintaining may be performed by, for instance, a pair of cross-coupled inverters 602 disposed at the outputs of each ring stage 308.

Example implementations for the latching operation of the block 1106 can further include inverting a first voltage level of a first output (e.g., a first ring stage output (RSO_p)) of the respective ring stage 308 to produce a first inverted output; routing the first inverted output to a second output (e.g., a second ring stage output (RSO_m)) of the respective ring stage 308, such as by having a co-located node as part of a cross-coupling arrangement of a first latching inverter 602-1 and a second latching inverter 602-2; inverting a second voltage level of the second output to produce a second inverted output; and routing the second inverted output to the first output of the respective ring stage 308, such as by having a co-located node as part of the cross-coupling arrangement.

Figure 12:
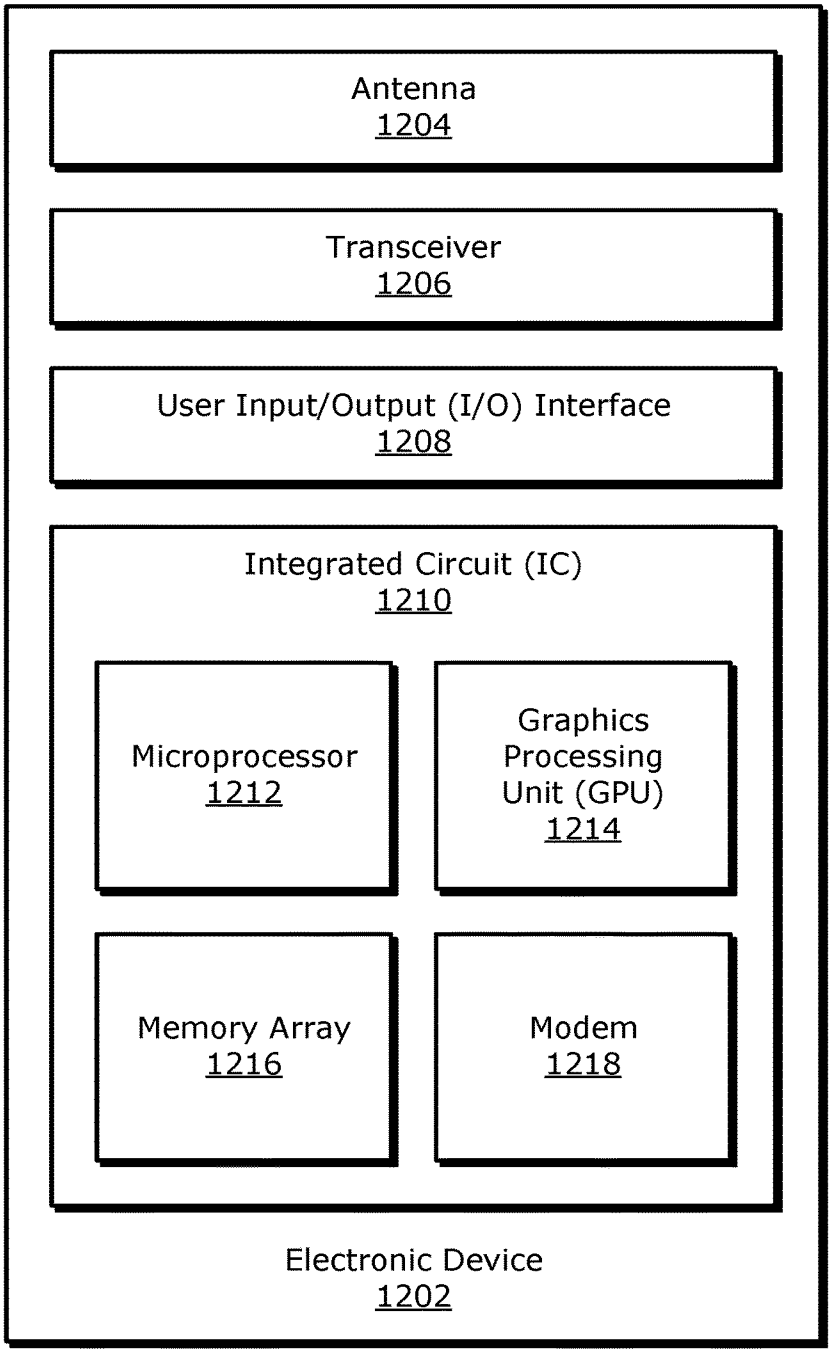
FIG. 12 illustrates an example electronic device that includes an integrated circuit in which a TDC as described herein can be implemented.

FIG. 12 depicts an example electronic device 1202 that includes an integrated circuit (IC) 1210 in which a TDC as described herein can be implemented. As shown, the electronic device 1202 includes an antenna 1204, a transceiver 1206, and a user input/output (I/O) interface 1208 in addition to the integrated circuit 1210. Illustrated examples of the integrated circuit 1210, or cores thereof, include a microprocessor 1212, a graphics processing unit (GPU) 1214, a memory array 1216, and a modem 1218. In one or more implementations, time-to-digital conversion techniques as described herein can be implemented by the integrated circuit 1210, e.g., by producing a digital representation of a duration 104 between an initiating event 114 and a terminating event 116.

The electronic device 1202 can be a mobile or battery-powered device or a fixed device that is designed to be powered by an electrical grid. Examples of the electronic device 1202 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1202 can also be a device, or a portion thereof, having embedded electronics. Examples of the electronic device 1202 with embedded electronics include a passenger vehicle, industrial equipment, a refrigerator or other home appliance, a drone or other unmanned aerial vehicle (UAV), a power tool, or an Internet of Things (IoT) device.

For an electronic device with a wireless capability, the electronic device 1202 includes an antenna 1204 that is coupled to a transceiver 1206 to enable reception or transmission of one or more wireless signals. The integrated circuit 1210 may be coupled to the transceiver 1206 to enable the integrated circuit 1210 to have access to received wireless signals or to provide wireless signals for transmission via the antenna 1204. The electronic device 1202 as shown also includes at least one user I/O interface 1208. Examples of the user I/O interface 1208 include a keyboard, a mouse, a microphone, a touch-sensitive screen, a camera, an accelerometer, a haptic mechanism, a speaker, a display screen, or a projector.

The integrated circuit 1210 may comprise, for example, one or more instances of a microprocessor 1212, a GPU 1214, a memory array 1216, a modem 1218, and so forth. The microprocessor 1212 may function as a central processing unit (CPU) or other general-purpose processor. Some microprocessors include different parts, such as multiple processing cores, that may be individually powered on or off. The GPU 1214 may be especially adapted to process visual-related data for display. If visual-related data is not being rendered or otherwise processed, the GPU 1214 may be fully or partially powered down. The memory array 1216 stores data for the microprocessor 1212 or the GPU 1214. Example types of memory for the memory array 1216 include random access memory (RAM), such as dynamic RAM (DRAM) or static RAM (SRAM); flash memory; and so forth. If programs are not accessing data stored in memory, the memory array 1216 may be powered down overall or by individual areas. The modem 1218 demodulates a signal to extract encoded information or modulates a signal to encode information into the signal. If there is no information to decode from an inbound communication or to encode for an outbound communication, the modem 1218 may be idled to reduce power consumption. The integrated circuit 1210 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1210 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, like that of an integrated circuit 1210 generally, may be termed cores or blocks of circuitry. A core or block of an SOC may be powered down if not in use, such as by undergoing a power collapse or by being multiplexed onto a power rail having a lower voltage level. Examples of cores or blocks include, in addition to those that are illustrated in FIG. 12, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or blocks, such as a processing or GPU core, may further include multiple internal cores or blocks that can be individually powered.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:

a ring including multiple ring stages, the ring configured to propagate a ring signal between successive ring stages of the multiple ring stages, each respective ring stage including latch circuitry configured to secure a state of the ring signal at the respective ring stage, the ring configured to provide a ring output signal using the latch circuitry of each of the multiple ring stages, the ring configured to propagate the ring signal through the latch circuitry of a particular ring stage of the multiple ring stages to propagate the ring signal from a preceding ring stage to a succeeding ring stage;

a counter coupled to the ring, the counter configured to increment a counter value responsive to the ring signal and to provide a counter output signal based on the counter value;

an encoder coupled to the ring and the counter, the encoder configured to generate a time-to-digital converter (TDC) output signal based on the ring output signal and the counter output signal; and TDC control circuitry configured to operate the ring responsive to at least one TDC input signal.

2. The integrated circuit of claim 1, wherein:

the ring signal comprises complementary voltage levels extending along the ring; and the latch circuitry of each respective ring stage of the multiple ring stages is configured to enforce the complementary voltage levels of the respective ring stage.

3. The integrated circuit of claim 1, wherein the latch circuitry of each respective ring stage of the multiple ring stages is configured to maintain a state of the respective ring stage after the ring signal ceases to propagate through the ring.

4. The integrated circuit of claim 1, wherein the latch circuitry comprises a pair of cross-coupled inverters.

5. The integrated circuit of claim 4, further comprising:

a relatively higher voltage level power rail; and a relatively lower voltage level power rail, wherein the pair of cross-coupled inverters are coupled in parallel between the relatively high voltage power rail and the relatively low voltage power rail.

6. The integrated circuit of claim 1, wherein:

the at least one TDC input signal is indicative of an initiating event and a terminating event; and the encoder is configured to generate the TDC output signal to provide a digital representation of a duration between the initiating event and the terminating event.

7. The integrated circuit of claim 1, wherein each respective ring stage of the multiple ring stages includes oscillation circuitry coupled to the latch circuitry, the oscillation circuitry configured to invert the ring signal as the ring signal propagates through the respective ring stage.

8. The integrated circuit of claim 7, wherein the oscillation circuitry comprises two inverters that are coupled in parallel to each other in a direction aligned with propagation of the ring signal.

9. The integrated circuit of claim 7, wherein the oscillation circuitry includes enablement circuitry configured to enable or disable propagation of the ring signal through the respective ring stage.

10. The integrated circuit of claim 9, wherein the TDC control circuitry is configured to enable or disable propagation of the ring signal through the ring using the enablement circuitry of each ring stage of the multiple ring stages responsive to the at least one TDC input signal.

11. The integrated circuit of claim 1, wherein each respective ring stage of the multiple ring stages includes initialization circuitry coupled to the latch circuitry, the initialization circuitry configured to initialize the state of the ring signal at the respective ring stage using the latch circuitry.

12. The integrated circuit of claim 11, wherein the TDC control circuitry is configured to provide a stage set signal to the initialization circuitry to initialize at least one voltage level for the respective ring stage using the latch circuitry.

13. The integrated circuit of claim 1, wherein the TDC control circuitry is configured to implement a programmable resolution for the ring using a constant supply voltage level.

14. The integrated circuit of claim 13, wherein the TDC control circuitry is configured to implement the programmable resolution for the ring by enabling one voltage-pulling switch and disabling another voltage-pulling switch.

15. An integrated circuit comprising:

a ring configured to propagate a ring signal over the ring across multiple ring stages and to provide a ring output signal, each respective ring stage including:

means for latching a state of the ring signal at the respective ring stage; and means for oscillating at least one voltage level of the ring signal at the respective ring stage;

a counter coupled to the ring, the counter configured to increment a counter value responsive to the ring signal and to provide a counter output signal based on the counter value;

an encoder coupled to the ring and the counter, the encoder configured to generate a time-to-digital converter (TDC) output signal based on the ring output signal and the counter output signal; and TDC control circuitry configured to operate the ring responsive to at least one TDC input signal.

16. The integrated circuit of claim 15, wherein the means for latching comprises means for enforcing complementary voltage levels as the state of the ring signal at the respective ring stage.

17. The integrated circuit of claim 15, wherein the means for latching comprises means for maintaining the state of the ring signal at the respective ring stage after propagation of the ring signal over the ring ceases.

18. The integrated circuit of claim 15, wherein the means for oscillating includes means for enabling the ring signal to propagate across the respective ring stage.

19. The integrated circuit of claim 15, wherein each respective ring stage further includes means for initializing at least one voltage level of the ring signal at the respective ring stage using the means for latching.

20. The integrated circuit of claim 15, wherein each respective ring stage further includes means for implementing a programmable resolution for the ring using a constant supply voltage level.

21. A method for time-to-digital conversion with a latch-based ring, the method comprising:

propagating a ring signal between multiple ring stages of a ring, the ring signal including complementary voltage levels;

in each respective ring stage of the multiple ring stages, inverting the complementary voltage levels of the ring signal to produce inverted complementary voltage levels; and latching the inverted complementary voltage levels of the ring signal to produce latched complementary voltage levels of the ring signal at the respective ring stage;

incrementing a counter value responsive to the ring signal;

providing a ring output signal indicative of the latched complementary voltage levels of the multiple ring stages of the ring;

providing a counter output signal indicative of the counter value; and generating a digital representation of an elapsed time based on the ring output signal and the counter output signal.

22. The method of claim 21, further comprising:

initiating the propagating of the ring signal responsive to an initiating event corresponding to the elapsed time; and terminating the propagating of the ring signal responsive to a terminating event corresponding to the elapsed time.

23. The method of claim 21, wherein the latching comprises enforcing complementary values of the inverted complementary voltage levels as the ring signal is propagated over the ring.

24. The method of claim 21, wherein the latching comprises maintaining the latched complementary voltage levels after the propagating of the ring signal is terminated.

25. The method of claim 21, wherein the latching comprises:

inverting a first voltage level of a first output of the respective ring stage to produce a first inverted output;

routing the first inverted output to a second output of the respective ring stage;

inverting a second voltage level of the second output to produce a second inverted output; and routing the second inverted output to the first output of the respective ring stage.

26. The method of claim 21, further comprising initially setting a voltage level of the complementary voltage levels of alternating outputs of the multiple ring stages along the ring.

27. The method of claim 21, further comprising:

controlling at least one enablement switch at each respective ring stage of the multiple ring stages to implement a programmable resolution for the ring.

28. An integrated circuit comprising:

a time-to-digital converter (TDC) configured to produce a TDC output signal based on a ring value, the TDC including a ring that propagates a ring signal over multiple ring stages and establishes the ring value with the multiple ring stages, each respective ring stage including:

oscillation circuitry configured to receive the ring signal from a preceding ring stage and to invert complementary voltage levels of the ring signal to produce inverted complementary voltage levels for the respective ring stage; and latch circuitry configured to latch the inverted complementary voltage levels to produce latched complementary voltage levels for the respective ring stage and to forward the latched complementary voltage levels to a succeeding ring stage.

29. The integrated circuit of claim 28, wherein:

the oscillation circuitry comprises two inverters coupled in parallel to each other to invert the complementary voltage levels of the ring signal to produce the inverted complementary voltage levels for the respective ring stage; and the latch circuitry comprises a pair of inverters that are cross-coupled with respect to each other to latch the inverted complementary voltage levels to produce the latched complementary voltage levels for the respective ring state.

30. The integrated circuit of claim 28, wherein:

the TDC further includes a counter and an encoder;

the counter is configured to produce a counter value that is incremented responsive to the ring signal; and the encoder is configured to:

receive the ring value from the ring via the latch circuitry of each respective ring stage;

receive the counter value from the counter; and generate the TDC output signal by encoding the ring value as least significant bits of the TDC output signal and by incorporating the counter value as most significant bits of the TDC output signal.

* * * * *